(12) United States Patent
Takahashi et al.

(10) Patent No.: US 8,957,695 B2
(45) Date of Patent: Feb. 17, 2015

(54) SEMICONDUCTOR DEVICE HAVING PLURAL SEMICONDUCTOR CHIP STACKED WITH ONE ANOTHER

(71) Applicant: Elpida Memory, Inc., Tokyo (JP)

(72) Inventors: Tetsuji Takahashi, Tokyo (JP); Toru Ishikawa, Tokyo (JP)

(73) Assignee: PS4 Luxco S.A.R.L, Luxembourg (LU)

( * ) Notice: Subject to any disclaimer, the term of this patent is extended or adjusted under 35 U.S.C. 154(b) by 63 days.

(21) Appl. No.: 13/720,863

(22) Filed: Dec. 19, 2012

(65) Prior Publication Data

US 2013/0153898 A1    Jun. 20, 2013

(30) Foreign Application Priority Data

Dec. 20, 2011    (JP) .................................. 2011-278311

(51) Int. Cl.
*H01L 21/66*    (2006.01)
*H01L 25/18*    (2006.01)
(Continued)

(52) U.S. Cl.
CPC .............. *H01L 22/32* (2013.01); *H01L 22/34* (2013.01); *H01L 25/18* (2013.01); *H01L 23/3128* (2013.01); *H01L 2224/16145* (2013.01); *H01L 2224/16225* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2924/15311* (2013.01); *H01L 2224/48091* (2013.01); *H01L 2924/00014* (2013.01); *H01L 24/13* (2013.01); *H01L 24/16* (2013.01); *H01L 2224/05096* (2013.01); *H01L* (Continued)

(58) Field of Classification Search
CPC ............................................ H01L 22/30–22/34
USPC ............ 324/762.01–762.1; 257/48, 734, 737, 257/738, 780
See application file for complete search history.

(56) References Cited

U.S. PATENT DOCUMENTS 7,759,716 B2    7/2010 Baek et al.
2008/0130388 A1*    6/2008 Mimoto ......................... 365/201
2009/0001367 A1*    1/2009 Baek et al. ....................... 257/48

FOREIGN PATENT DOCUMENTS

JP    2009-010390 A    1/2009

*Primary Examiner* — Matthew W Such
*Assistant Examiner* — David Spalla
(74) *Attorney, Agent, or Firm* — McGinn IP Law Group, PLLC

(57) ABSTRACT

Disclosed herein is a device that includes: external terminals; a first chip including a first control circuit that generates a first control signal; and a second chip stacked with the first chip. The second chip includes: a first test terminal supplied with a first test signal and being free from connecting to any one of the external terminals; a second test terminal supplied with the first test signal and coupled to one of the external terminals without connecting to any one of control circuits of the first chip; a first normal terminal supplied with the first control signal and coupled to another of the external terminals with an intervention of the first control circuit of the first chip; and a first selection circuit including first input node coupled in common to the first and second test terminals and the second input node coupled to the first normal terminal.

11 Claims, 10 Drawing Sheets

(51) Int. Cl.
*H01L 23/31* (2006.01)
*H01L 23/00* (2006.01)

(52) U.S. Cl.
CPC ................ *H01L2225/06506* (2013.01); *H01L 2225/06544* (2013.01)

USPC ............ 324/762.06; 324/762.01; 324/762.02; 257/48; 257/7802224/13082 (2013.01); *H01L 2224/14181* (2013.01); *H01L 2225/0651* (2013.01); *H01L 2225/06596* (2013.01); *H01L 2225/06513* (2013.01); 2224/05567 (2013.01); *H01L 2224/13009* (2013.01); *H01L 2224/13022* (2013.01); *H01L*

SEMICONDUCTOR DEVICE HAVING PLURAL SEMICONDUCTOR CHIP STACKED WITH ONE ANOTHER

BACKGROUND OF THE INVENTION

1. Field of the Invention

The present invention relates to a semiconductor device, and more particularly to a semiconductor device having penetration electrodes that penetrates through a semiconductor chip.

2. Description of Related Art

In recent years, a semiconductor device of a stacked type is proposed (see Japanese Patent Application Laid-Open No. 2009-10390, for example). The semiconductor device of this type includes a plurality of semiconductor chips stacked one another and electrically connected to one another by penetration electrodes that penetrates through respective semiconductor chip. The semiconductor device of this type enables the semiconductor chips to be mounted on a circuit substrate in high density.

In the stacked semiconductor device disclosed in Japanese Patent Application Laid-Open No. 2009-10390, each of the semiconductor chips is subjected to a test operation by using a plurality of pads 120 (test pads) provided to each of the semiconductor chips before the semiconductor chips are stacked. After the test operation, a first penetration electrode 155 that penetrates through respective semiconductor chip is so formed as to pass through the pad 120 with insulated from the pad 120. After the semiconductor chips are stacked, the first penetration electrode 155 is used as a signal path of a chip selection signal.

In order to perform a test operation to the stacked semiconductor device disclosed in Japanese Patent Application Laid-Open No. 2009-10390 after the semiconductor chips are stacked, test signals should be input and output via penetration electrodes that is used in a normal operation. However, the following problem may arise when the test operation of the stacked semiconductor device is carried out by the above method.

That is, in a stacked semiconductor device in which a plurality of memory chips and a control chip that controls the memory chips are stacked and connected to one another via penetration electrodes, an operation of the memory chips is controlled by the control chip during normal operation. When the memory chips are subjected to the test operation after the memory chips and the control chip are stacked, the test signals to the memory chips are necessary to supply from various internal circuits in the control chip. If a defect is discovered during the test operation, it is difficult to determine whether the memory chips or the control chip is responsible for the defect. Therefore, as for a stacked semiconductor device in which a plurality of semiconductor chips are stacked and connected to one another through penetration electrodes, it is desirable that a penetration electrode dedicated to the test operation be placed to transmit a test signal via a different route from that of the normal operation.

However, if a penetrating electrode for the test operation is provided to the memory chips in addition to penetrating electrodes for the normal operation, an additional chip area is necessary to dispose the penetrating electrodes for the test operation. In addition, interconnection lines in the memory chips are also necessary to transmit the test signals supplied from a plurality of the penetration electrodes for the test operation. As a result, therefore, a chip area of the memory chips inevitably increase in this case.

SUMMARY

In one embodiment, there is provided a semiconductor device that includes: a plurality of external terminals including first and second external terminals; a first semiconductor chip including a plurality of control circuits that comprises a first control circuit, the first control circuit generating a first control signal; and a second semiconductor chip stacked with the first semiconductor chip, the second semiconductor chip comprising; a first test terminal configured to be supplied with a first test signal, the first test terminal being free from connecting to anyone of the external terminals; a second test terminal configured to be supplied with the first test signal, the second test terminal being coupled to the first external terminal without connecting to any one of control circuits of the first semiconductor chip; a first normal terminal configured to be supplied with the first control signal, the first normal terminal being coupled to the second external terminal with an intervention of the first control circuit of the first semiconductor chip; and a first selection circuit including first and second input nodes, the first input node being coupled in common to the first and second test terminals and the second input node being coupled to the first normal terminal.

In another embodiment, there is provided a semiconductor device that includes: a first test pad; a first test bump electrode; a first normal bump electrode; a first test input buffer coupled in common to the first test pad and the first test bump electrode at an input node thereof; and a first normal input buffer coupled to the first normal bump electrode at an input node thereof.

According to the present invention, a first test terminal and a second test terminal are connected in common to one input node of a selection circuit. As a result, it is possible to curb an increase in the number of interconnection line regions within a semiconductor chip that has both of the first and second test terminals, as well as to prevent an increase in the size of the semiconductor chip.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

First Embodiment

According to the first embodiment of the present invention, what is described as one example is a stacked semiconductor device 10 that includes four memory chips and a SOC (System-On-Chip) chip. According to the present embodiment, the five semiconductor chips are mounted in one package with the use of TSV (Through-substrate Via) technology.

Figure 1:
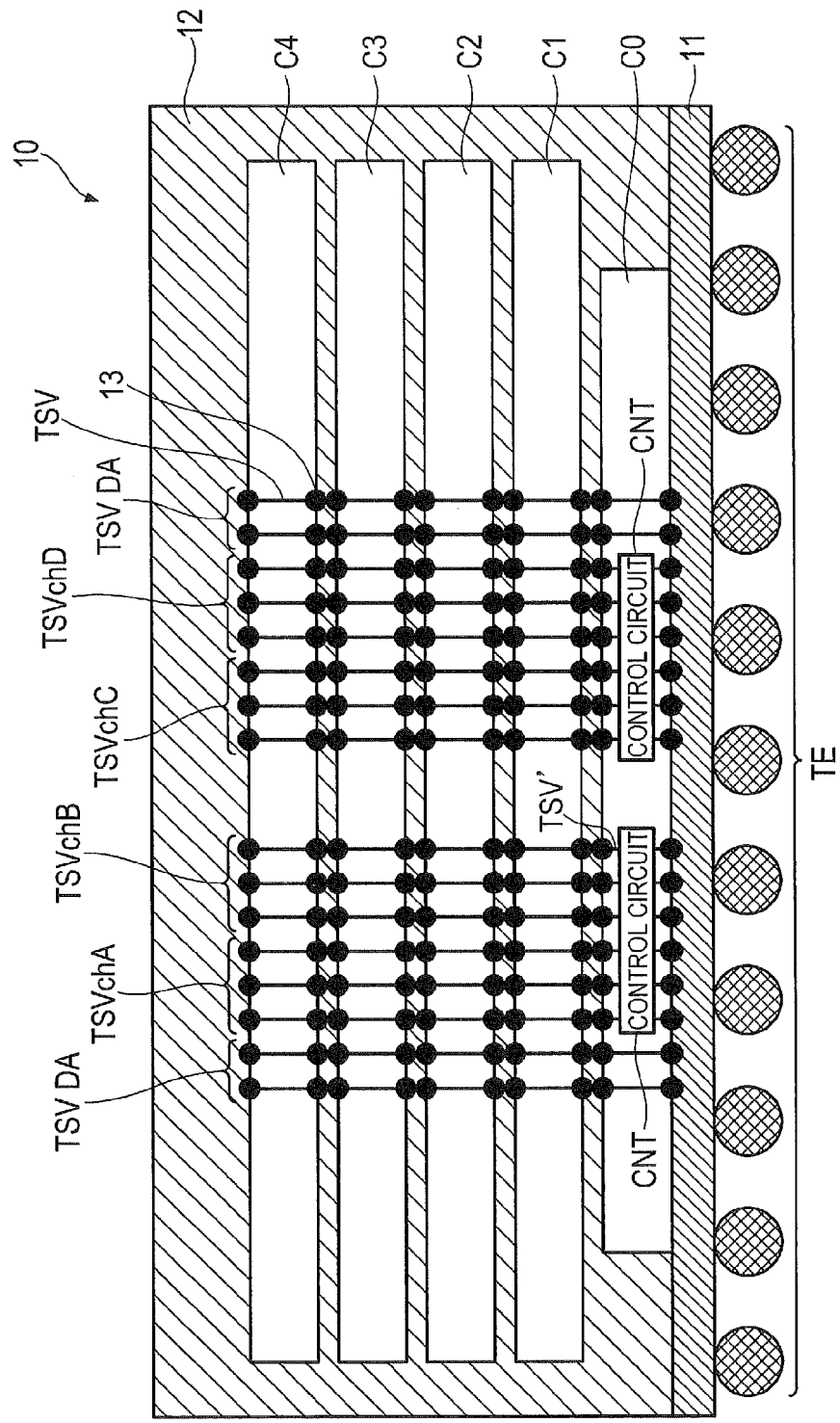
FIG. 1 is a cross-sectional view showing the schematic configuration of a stacked semiconductor device according to a first embodiment of the present invention.

Referring now to FIG. 1, the stacked semiconductor device 10 according to the present embodiment includes four memory chips C1 to C4, a SOC chip C0, and a package substrate 11.

The chip C0 and the chips C1 to C4 are stacked on the package substrate 11, and encapsulated by encapsulation resin 12. That is, on the package substrate 11, a plurality of semiconductor chips are mounted, and a plurality of the semiconductor chips and the package substrate 11 are encapsulated by the same encapsulation resin 12. Incidentally, the number of chips stacked on the chip C0 is not limited to four. Hereinafter, the chips C0 to C4 are assumed to be stacked in a face-down manner when the stacked semiconductor device 10 of the present embodiment is described. However, the way that the chips C0 to C4 are stacked is not limited to the face-down type, and may be a face-up type.

On a surface of the package substrate 11 that is opposite to the surface covered with the encapsulation resin 12, a plurality of external terminals TE are provided. For example, each of the external terminals TE may be a solder ball that is designed to electrically connect the stacked semiconductor device 10 and an external device (not shown in FIG. 1).

Each of the chips C0 to C4 includes a plurality of penetration electrodes TSV. The chips C0 to C4 are electrically connected via the penetration electrodes TSV and bump electrodes 13. For example, the penetration electrodes TSV of the chip C1 and the penetration electrodes TSV of the chip C2 are electrically connected to each other through the bump electrodes 13 that are provided on a back-surface (upward direction in FIG. 1) of the chip C1, and the bump electrodes 13 that are provided on a top-surface (downward direction in FIG. 1) of the chip C2.

The penetration electrodes TSV of the chip C0 are electrically connected to the external terminals TE via the bump electrodes 13 that are provided on a top-surface of the chip C0, and a rewiring layer (not shown in FIG. 1) formed on the package substrate 11. In this manner, the chips C1 to C4 are electrically connected to an external device, which is located outside the stacked semiconductor device 10, via the chip C0 and the external terminals TE. The external device may be an arithmetic unit such as CPU (Central Processing Unit), or a test device when a test operation is carried out. Under the control of the chip C0, the operation of each of the chips C1 to C4 is carried out.

Figure 10:
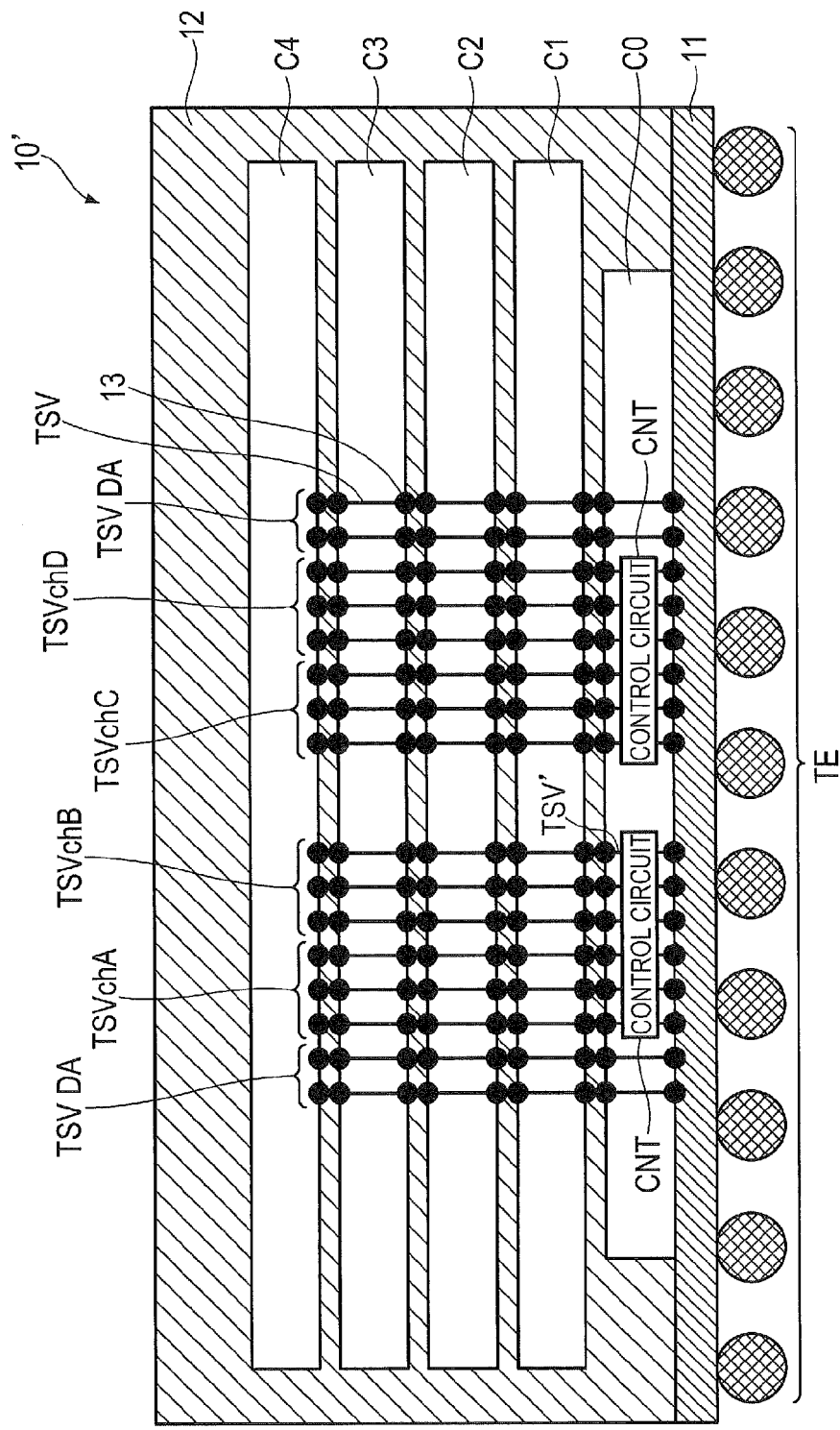
FIG. 10 is a cross-sectional view showing the schematic configuration of a stacked semiconductor device according to a modified embodiment of the present invention.

The uppermost chip C4 may not have the penetration electrodes TSV and the bump electrodes 13 on a back-surface thereof because no semiconductor chip is stacked on the back-surface of the chip C4. A configuration of this type of semiconductor device 10' in which the uppermost chip C4 does not have the penetration electrodes TSV and the bump electrodes 13 on a back-surface thereof is shown in FIG. 10.

The penetration electrodes TSV of the chip C0 include penetrating electrodes TSV' that make up four groups of penetration electrodes TSVchA to TSVchD that are electrically respectively connected to a plurality of control circuits CNT, and penetration electrodes TSV that make up one group of penetration electrode TSV DA that is not electrically connected to any one of the control circuits CNT.

The penetration electrodes TSV formed on the chips C1 to C4 include four groups of penetration electrodes TSVchA to TSVchD that are vertically aligned with the penetration electrodes TSV' formed on the chip C0. The penetration electrodes TSV formed on the chips C1 to C4 further include a plurality of penetration electrodes TSV DA that are vertically aligned with the penetration electrodes TSV DA formed on the chip C0.

Figures 2A, 2B:
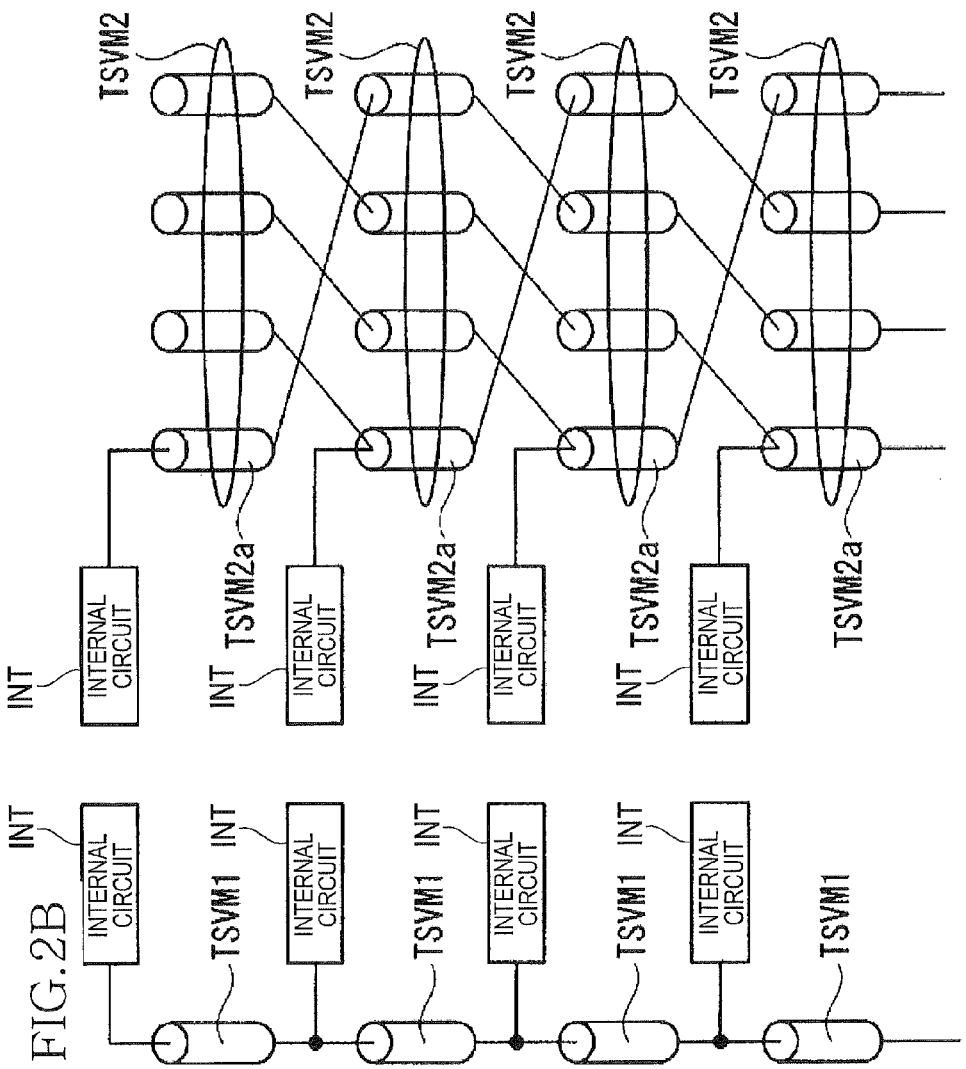
FIG. 2A is a diagram schematically showing connection relation between the penetration electrodes of the chip C0 and the penetration electrodes of the chips C1 to C4.
FIG. 2B is a diagram schematically showing connection relation between the penetration electrodes of chips C1 to C4.

Turning to FIG. 2A, two types of penetration electrodes TSVS1 and TSVS2 provided on the chip C0 are shown. The penetration electrode TSVS1 is electrically connected to penetration electrodes TSVM formed on the chips C1 to C4, which are described later, via a control circuit CNT provided inside the chip C0. For example, the penetration electrode TSVS1 corresponds to the penetration electrodes TSV' that make up the above-described four groups of penetration electrode TSVchA to TSVchD on the chip C0.

The penetration electrode TSVS2 is electrically connected to the penetration electrodes TSVM without passing through a control circuit CNT of the chip C0. For example, the penetration electrode TSVS2 corresponds to the penetration electrodes TSV that make up the above-described one group of penetrating electrode TSV DA of the chip C0.

Turning to FIG. 2B, two types of penetration electrodes TSVM1 and TSVM2 provided on the chips C1 to C4 are shown. As for the penetration electrodes TSVM1, the upper and lower penetration electrodes TSVM1 that are provided at the same position in planar view are short-circuited so as to form one conductive line that is electrically connected to internal circuits INT provided in the chips C1 to C4. For example, the penetration electrodes TSVM1 are used to the four groups of penetration electrode TSVchA to TSVchD and penetration electrodes that make up one group of penetration electrode TSV DA.

The penetration electrodes TSVM2 are short-circuited with penetration electrodes TSVM2 of another chip that is provided at a different position in planar view. As for such penetration electrodes TSVM2, an internal circuit INT of each chip is connected to a penetration electrode TSVM2a that is provided at a predetermined position in planar view on each of the chips C1 to C4. As a result, it becomes possible to selectively input information into an internal circuit INT provided in each chip. For example, the penetration electrodes TSVM2 are used to some in the above four groups of penetrating electrode TSVchA to TSVchD and penetration electrodes that are used to transmit a chip select signal, test chip select signal, clock enable signal, and test clock enable signal, which are described later.

Figure 3:
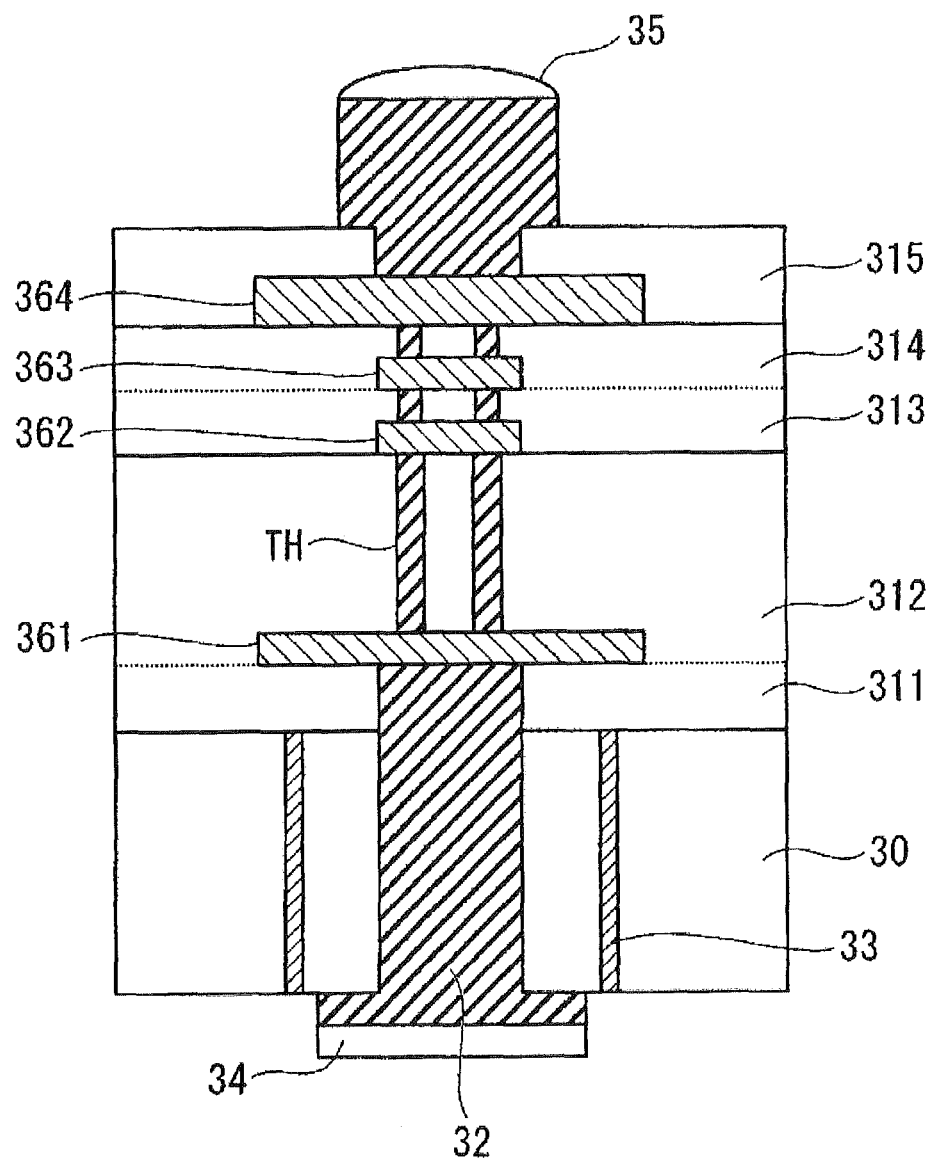
FIG. 3 is a cross-sectional view showing the configuration of a penetration electrode TSVM1 shown in FIG. 2B.

As shown in FIG. 3, the penetration electrode TSVM1 includes a substrate penetrating portion 32 that penetrates through a silicon substrate 30 and an interlayer insulation film 311 on the top surface thereof. The penetration electrode TSVM1 further includes pads 361 to 364 that are provided on wiring layers 312 to 315, a plurality of through-hole electrodes TH that connect the pads, a back-surface bump 34, and a top-surface bump 35. Incidentally, on the periphery of the substrate penetrating portion 32, an insulation ring 33 is provided to ensure the insulation of TSVM1 from a transistor region.

An end portion of the substrate penetrating portion 32 on the back-surface side of the silicon substrate 30 is covered with the back-surface bump 34. The back-surface bump 34 is an electrode that is connected to a top-surface bump 35 provided on another chip. The back-surface and top-surface bumps 34 and 35 correspond to the bump electrodes 13 shown in FIG. 1. The top-surface bump 35 is connected to an end portion of the substrate penetrating portion 32 via the pads 361 to 364, which are provided on the wiring layers 312 to 315, and a plurality of the through-hole electrodes TH that connect the pads. Incidentally, the top-surface bump 35 is electrically connected to an internal circuit (not shown) via interconnection lines (not shown) that are elongated from the pads 361 to 364 provided as the wiring layers 312 to 315.

Figure 4:
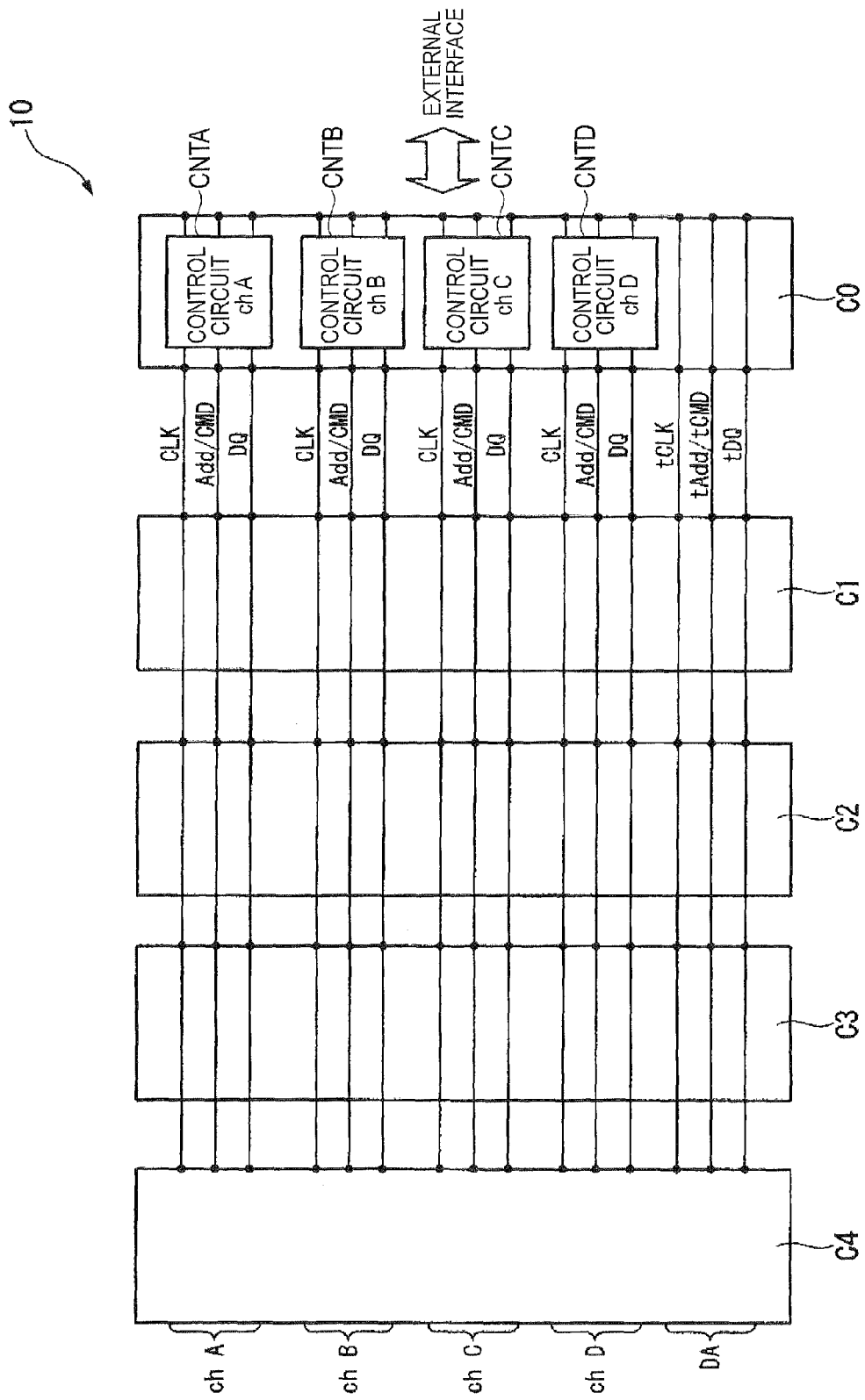
FIG. 4 is a conceptual diagram showing electrical connection between the chips in the stacked semiconductor device shown in FIG. 1.

As one example of the chips C1 to C4, what is shown in FIG. 4 is the stacked semiconductor device 10 that uses semiconductor chips called wide IODRAM.

The wide IODRAM includes a plurality of DRAMs (Dynamic Random Access Memory) integrated on one semiconductor chip (which may be referred to simply as chip, hereinafter). The DRAMs on the chip are called channels. That is, what is shown in FIG. 4 is an example of the stacked semiconductor device 10 in which four wide IODRAMs, by which four DRAMs are regarded as channels ch A to ch D, respectively, are stacked on the chip C0. Incidentally, the number of DRAMs (or channels) on one chip is not limited to four.

As shown in FIG. 4, data DQ, command address signals Add/CMD (including address signal Add and command signal CMD), and clock signals CLK are supplied independently to the channels ch A to ch D on one chip from the chip C0. According to the above configuration, under the control of control circuits CNTA to CNTD disposed on the chip C0, each of the channels ch A to ch D of one chip can independently perform various operations, such as a reading operation, writing operation, and refresh operation, for example.

As shown in FIG. 4, the data DQ, command address signals Add/CMD, and clock signals are provided to each of the channels and supplied in common to the same channels of each of the chip C1 to C4.

The data DQ, command address signals Add/CMD, and clock signals that are supplied from the control circuits CNTA to CONTD are transmitted via the four groups of the penetration electrode TSVchA to TSVchD shown in FIG. 1, respectively. In this case, the four groups of penetration electrode TSVchA to TSVchD are so provided as to correspond to the channels ch A to ch D of each chip, respectively. That is, the signal paths that are used to transmit a plurality of control signals (the data DQ, command address signals Add/COMD, and clock signals) to each channel are made up of one of the penetration electrodes TSVchA to TSVchD shown in FIG. 1.

With respect to test data tDQ, a test address command tAdd/tCMD (including test address signal tAdd and test command signal tCMD), a test clock signal tCLK, and the like, these signals are supplied from the external terminals TE of the stacked semiconductor device 10 shown in FIG. 1 to each of the chips C1 to C4 without passing through any of the control circuits CNTA to CNTD. That is, the signal paths that are used to transmit a plurality of test signals (the test data tDQ, test address command tAdd/tCMD, and test clock signal tCLK) are made up of penetration electrodes TSV DA shown in FIG. 1.

In the stacked semiconductor device 10 in which the chip C0 and the chips C1 to C4 are stacked, the signal paths that are used to transmit the test signals extend from the external terminals TE of the stacked semiconductor device 10, and are connected to each chip without passing through the control circuits CNTA to CNTD of the chip C0. That is, the test signals can be supplied from the external terminals TE of the stacked semiconductor device 10. Therefore, even after the chip C0 and chips C1 to C4 are stacked, it is possible to access each chip without passing through the control circuits CNTA to CNTD of the chip C0. Incidentally, while the details are described later, in the first embodiment, the test signals are shared by the four channels of each chip.

A plane view of the chip C1 is explained with reference to FIG. 5. The other chips C2 to C4 have the same configuration as the chip C1. The following describes the configuration of the chip C1.

Figure 5:
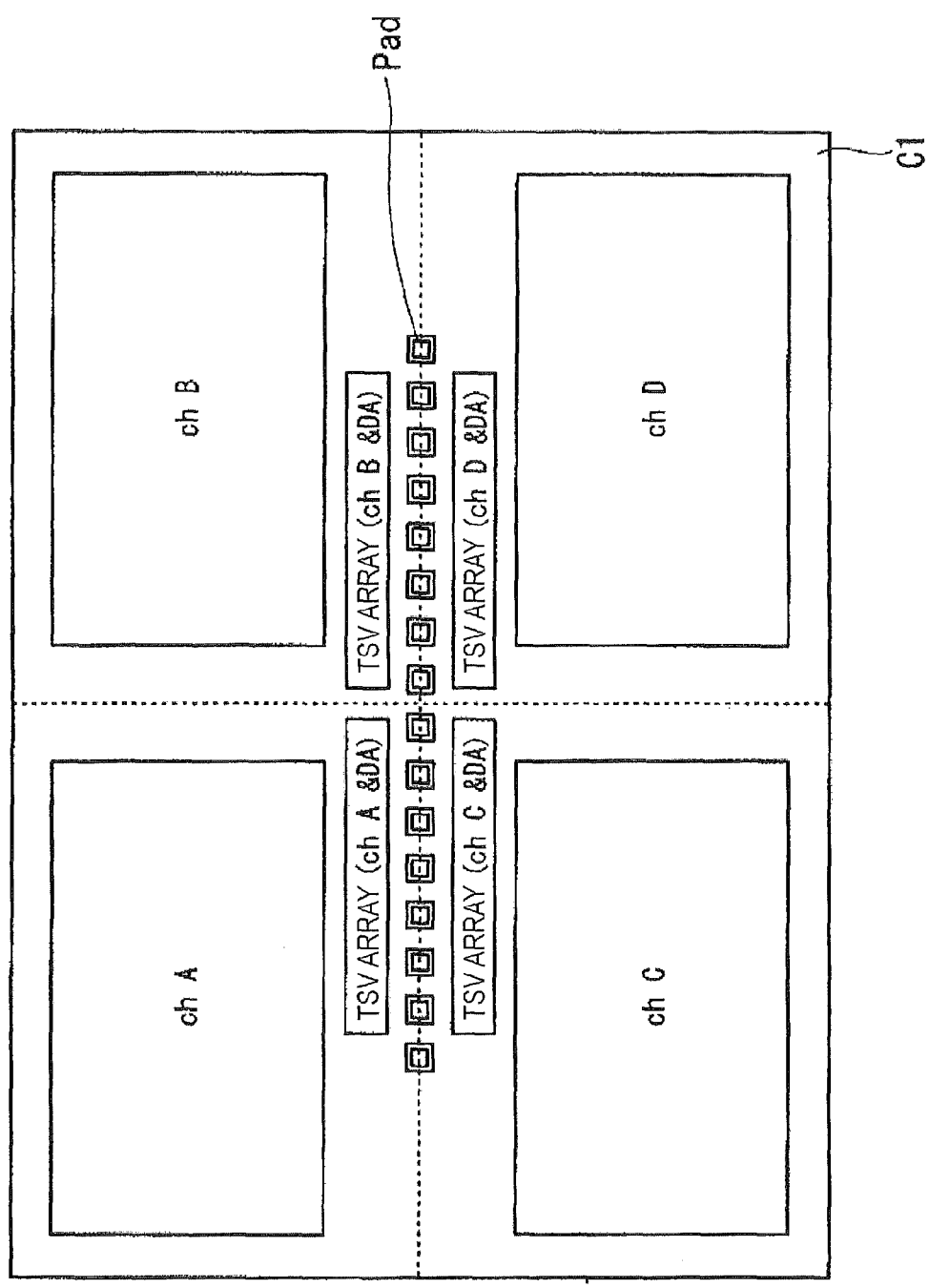
FIG. 5 is a plane view of the chip C1.

The four channels ch A to ch D shown in FIG. 4 are disposed in a 2×2 matrix pattern on a plane as shown in FIG. 5.

In a region where each channel is formed, an internal control circuit for the each channel, a storage area portion containing a memory cell array, and the like (not shown in FIG. 5) are formed.

Furthermore, penetration electrode arrays (TSV arrays), in which the penetration electrodes are disposed in a matrix pattern, are formed for the each channel so as to be adjacent to the regions where the channels are formed.

That is, the four groups of penetration electrodes TSVchA to TSVchD shown in FIG. 1 are disposed in the penetration electrode arrays of the regions where the corresponding channels are formed. For example, the penetration electrodes TSVchA are disposed in a TSV array (chA&DA) adjacent to a region where the channel ch A is formed. Similarly, the other three groups of penetration electrodes TSVchB to TSVchD are disposed in the TSV arrays adjacent to the regions where the corresponding channels are formed. The penetrating electrodes TSV DA shown in FIG. 1 are disposed on the four TSV arrays.

That is, in each TSV array (chi&DA) (i=a, b, c, d), the following are disposed: one group of the penetration electrodes TSVchi that are used to transfer the control signals to a corresponding channel; and some of the penetration electrodes TSV DA that are used to transfer the test signals.

As shown in FIG. 5, on the chip C1, a plurality of test pads Pad are disposed so as to be sandwiched between a TSV array line containing the TSV arrays (cha&DA) and (chb&DA) and a TSV array line containing the TSV arrays (chc&DA) and (chd&DA). The test pads Pad are used to test the chip C1 when the chip C1 is in a wafer state, i.e. before the chip C1 is stacked on the chip C0 (controller chip).

More specifically, a probe of an external test device comes, in contact with each of the test pads Pad of the chip C1, and the exchange of the test signals takes place between the test device and the chip C1. Based on the exchange of the test signals, the test device makes a determination as to whether or not the test data are appropriately written into each memory cell of the memory cell array in the chip C1, and whether the written test data are appropriately read.

While the details are described later, the test pads Pad are provided correspondingly to the penetration electrodes TSV DA. It is preferred that a test pad and a penetration electrode TSV DA that are provided correspondingly to each other are configured to receive substantially the same test signals.

Figure 6:
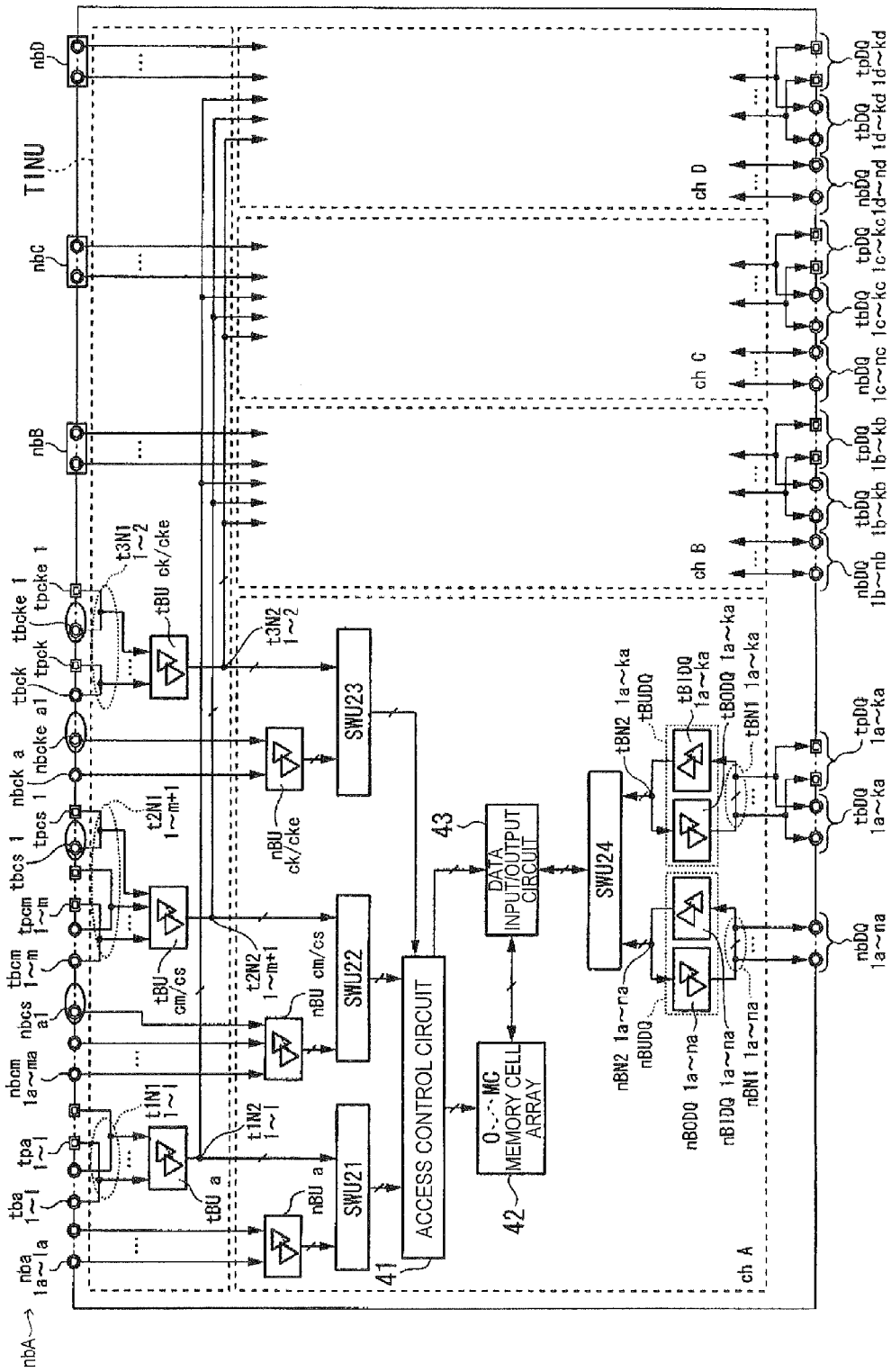
FIG. 6 is a circuit diagram showing an internal circuit configuration of the chip C1.

The internal circuit configuration of the chips C1 to C4 will be described in detail with reference to FIG. 6 through an example of the chip C1. FIG. 6 is a block diagram showing the chip C1 in detail.

Incidentally, in FIG. 6, reference symbols represented by double circle collectively indicate a penetration electrode, top-surface bump, and back-surface bump used as input/output terminals of the chip C1. Hereinafter, in the description of FIG. 6, in order to make the embodiment easy to understand, the reference symbols represented by double circle may be simply referred to as bumps. Reference symbols represented by double square indicate the test pads Pad shown in FIG. 5.

As shown in FIG. 6, the chip C1 includes a test signal input unit TINU, and the four channels ch A to ch D. The chip C1 also includes a normal bump group nbA and a normal data input/output bump nbDQ 1a to na that correspond to the penetration electrodes TSVchA shown in FIG. 1. The normal bump group nbA includes normal address bumps nba 1a to la, normal command bumps nbcm 1a to ma, a normal chip select bump nbcs a1, a normal clock bump nbck a, and a normal clock enable bump nbcke a1. The above normal bumps are connected to the channel ch A.

Similarly, the chip C1 includes a normal bump group nbB and normal data input/output bumps nbDQ 1b to nb that corresponds to the penetration electrodes TSVchB assigned to the channel ch B; a normal bump group nbC and normal data input/output bumps nbDQ 1c to nc that corresponds to the penetration electrodes TSVchC assigned to the channel ch C; and a normal bump group nbD and normal data input/output bumps nbDQ 1d to nd that corresponds to the penetration electrodes TSVchD assigned to the channel ch D. In this case, the normal bump group nbB, normal bump group nbC, and normal bump group nbD include a plurality of bumps having the same functions as those of the normal bump group nbA. The normal data input/output bumps nbDQ 1b to nb, normal data input/output bumps nbDQ 1c to nc, and normal data input/output bumps nbDQ 1d to nd have a plurality of bumps having the same functions as those of the normal data input/output bumps nbDQ 1a to na.

The chip C1 also includes a plurality of test bumps that correspond to the penetration electrodes TSV DA shown in FIG. 1. The test bumps includes test address bumps tba 1 to l, test command bumps tbcm 1 to m, a test chip select bump tbcs 1, a test clock bump tbck, a test clock enable bump tbcke 1, test data input/output bumps tbDQ 1a to ka, test data input/output bumps tbDQ 1b to kb, test data input/output bumps tbDQ 1c to kc, and test data input/output bumps tbDQ 1d to kd. Among the above test bumps, the test bumps except the test data input/output bumps are connected in common to the test signal input unit TIUN. The test data input/output bumps are connected to respective one of the channels ch A to ch D.

The chip C1 also includes a plurality of test pads that correspond to the test pads Pad shown in FIG. 4. The test pads includes test address pads tpa 1 to l, test command pads tpcm 1 to m, a test chip select pad tpcs 1, a test clock pad tpck, a test clock enable pad tpcke 1, test data input/output pads tpDQ 1a to ka, test data input/output pads tpDQ 1b to kb, test data input/output pads tpDQ 1c to kc, and test data input/output pads tpDQ 1d to kd. Among the above test pads, the test pads except the test data input/output pads are connected in common to the test signal input unit TIUN. The test data input/output pads are connected to respective one of the channels ch A to ch D.

In FIG. 6, the configuration of the channel ch A is shown in detail, among the four channels ch A to ch D. The other channels have substantially the same configuration. Hereinafter, the channel ch A will be detailed.

The normal bump group nbA serves as a control signal input terminal of the channel ch A. The normal bump group nbA includes a plurality of normal address bumps nba 1a to la, a plurality of normal command bumps nbcm 1a to ma, a normal chip select bump nbcs a1, a normal clock bump nbck a, and a normal clock enable bump nbcke a1.

The plurality of normal address bumps nba 1a to la are supplied with a plurality of address signals Add from outside of the chip C1.

The plurality of normal command bumps nbcm 1a to ma are supplied with a plurality of command signals CMD from outside of the chip C1.

The normal chip select bump nbcs a1 is supplied with a chip select signal CS that is a part of the command signals CMD from outside of the chip C1.

The normal clock bump nbck a is supplied with a clock signal CLK from outside of the chip C1.

The normal clock enable bump nbcke a1 is supplied with a clock enable signal CKE that is a part of the clock signal CLK from outside of the chip C1.

The normal data input/output bumps nbDQ 1a to na serve in a normal mode as data input/output terminals of the channel ch A. During a writing operation, the normal data input/output bumps nbDQ 1a to na receive a plurality of data sets DQ (write data) supplied from the outside. During a reading operation, the normal data input/output bumps nbDQ 1a to na receive a plurality of data sets DQ (read data) output from the channel ch A.

A plurality of test bumps serve as test signal input/output terminals of the chip C1. The test bumps include a plurality of test address bumps tba 1 to l, a plurality of test command bumps tbcm 1 to m, a test chip select bump tbcs 1, a test clock bump tbck, and a test clock enable bump tbcke 1.

The plurality of test address bumps tba 1 to l are supplied with a plurality of test address signals tAdd from outside of the chip C1.

The plurality of test command bumps tbcm 1 to m are supplied with a plurality of test command signals tCMD from outside of the chip C1.

The test chip select bump tbcs 1 is supplied with a test chip select signal tCS that is a part of the test command signals tCMD from outside of the chip C1.

The test clock bump tbck is supplied with a test clock signal tCLK from outside of the chip C1.

The test clock enable bump tbcke 1 is supplied with a test clock enable signal tCKE that is a part of the test clock signal tCLK from outside of the chip C1.

The test data input/output bumps tbDQ 1a to ka serve in a test mode as data input/output terminals of the channel ch A. During a writing operation, the test data input/output bumps tbDQ 1a to ka receive a plurality of test data sets tDQ (test write data) supplied from the outside. During a reading operation, the test data input/output bumps tbDQ 1a to ka receive test data tDQ (test read data) output from the channel ch A. It is preferred that the number (k) of a plurality of test data input/output bumps tbDQ1a to ka corresponding to the channel ch A is smaller than the number (n) of the normal data input/output bumps nbDQ 1a to na corresponding to a plurality of channels ch A (k<n).

A plurality of test pads serve as test signal input/output terminals of the chip C1 as well as a plurality of the test bumps. The test pads include a plurality of test address pads tpa 1 to l, a plurality of test command pads tpcm 1 to m, a test chip select pad tpcs 1, a test clock pad tpck, and a test clock enable pad tpcke 1.

The plurality of test address pads tpa 1 to l are supplied with a plurality of test address signals tAdd from outside of the chip C1.

The plurality of test command pads tpcm 1 to m are supplied with a plurality of test command signals tCMD from outside of the chip C1.

The test chip select pad tpcs 1 is supplied with a test chip select signal tCS that is a part of the test command signals tCMD from outside of the chip C1.

The test clock pad tpck is supplied with a test clock signal tCLK from outside of the chip C1.

The test clock enable pad tpcke 1 is supplied with a test clock enable signal tCKE that is a part of the test clock signal tCLK from outside of the chip C1.

The test data input/output pads tpDQ 1a to ka serve in a test mode as data input/output terminals of the channel ch A. During a writing operation, the test data input/output pads tpDQ 1a to ka receive a plurality of test data sets tDQ (test write data) supplied from the outside. During a reading operation, the test data input/output pads tpDQ 1a to ka receive test data tDQ (test read data) output from the channel ch A. It is preferred that the number (k) of a plurality of test data input/output pads tpDQ1a to ka corresponding to the channel ch A is smaller than the number (n) of the normal data input/output bumps nbDQ 1a to na corresponding to a plurality of channels ch A (k<n).

As described above, on the chip C1, two types of test signal input terminal, i.e. a plurality of test bumps and a plurality of test pads, are provided.

For example, after the chips C1 to C4 are stacked on the chip C0, i.e. when a probe of a test device cannot come in direct contact with a plurality of test pads from the outside, a plurality of test bumps can be used as the test signal input/output terminals of the chips C1 to C4. As described above, a plurality of the test bumps correspond to the penetration electrodes TSV DA shown in FIG. 1. Therefore, since a plurality of the test bumps are provided, the chips C1 to C4 can be directly accessed from the outside even after the chips C1 to C4 are mounted on the chip C0.

The following describes the configuration of the test signal input unit TINU.

The test signal input unit TINU is designed to supply the test signals supplied to the chip C1 to each channel in common. The test signal input unit TINU includes three test input buffer unit tBU a, test input buffer unit tBU cm/cs, and test input buffer unit tBU ck/cke.

The test input buffer units tBU a include a plurality of test address input buffers. An input node of each of the test address input buffers is electrically connected to an associated one of connection nodes t1N1 1 to l. Each of the connection nodes t1N1 1 to l is electrically connected in common to an associated one of the test address bumps tba 1 to l and an associated one of the test address pads tpa 1 to l.

The test input buffer units tBU cm/cs include a plurality of test command input buffers. An input node of each of the test command input buffers is electrically connected to an associated one of connection nodes t2N1 1 to m+1. Each of the connection nodes t2N1 1 to m+1 is electrically connected in common to an associated one of the test command bumps tbcm 1 to m and the test chip select bump tbcs 1 and an associated one of the test command pads tpcm 1 to m and the test chip select pad tpcs 1.

The test input buffer units tBU ck/cke include two test clock input buffers. An input node of one of the test clock input buffers is electrically connected to a connection node t3N1 1 that is electrically connected in common to the test clock bump tbck a1 and the test clock pad tpck. An input node of the other of the test clock input buffers is electrically connected to a connection node t3N1 2 that is electrically connected in common to the test clock enable bump tbcke 1 and the test clock enable pad tpcke 1.

As described above, the test signal input unit TINU of the present embodiment includes a plurality of test input buffers that are so provided as to correspond to a plurality of test input terminal pairs, which each include one test bump and one test pad. Each of the input nodes of the test input buffers are connected in common to the test bump and test pad contained in a corresponding test input terminal pair.

In other words, one test bump and one test pad that are contained in each of the test input terminal pairs are connected together through a signal line provided inside the chip. A node on the signal line inside the chip is connected to an input node of a corresponding test input buffer.

The output nodes of the test input buffers are connected in common to the four channels.

The following describes the internal configuration of the channel ch A. Incidentally, the channels ch B to ch D have the same configuration as the channel ch A, and the description thereof therefore will be omitted when necessary.

The channel ch A includes three normal input buffer unit nBU a, normal input buffer unit nBU cm/cs, and normal input buffer unit nBU ck/cke, four switch circuit units SWU21 to SWU24, an access control circuit 41, a memory cell array 42, a data input/output circuit 43, a normal data input/output buffer unit nBUDQ, and a test data input/output buffer unit tBUDQ. Each of the channels ch B to ch D also includes the above circuits.

The normal input buffer units nBU a includes a plurality of normal address input buffers, and an input node of each of the normal address input buffers is electrically connected to an associated one of the normal address bumps nba 1a to la. The normal input buffer unit nBU cm/cs includes a plurality of normal command input buffers, and an input node of each of the normal command input buffers is electrically connected to an associated one of the normal command bumps nbcm 1a to ma and the normal chip select bump nbcs a1. The normal input buffer unit nBU ck/cke includes two normal clock input buffers, and an input nodes thereof are electrically connected respectively to the normal clock bump nbcka and the normal clock enable bump tbcke a1.

The switch circuit units SWU21 to SWU23 are electrically connected respectively to output nodes of the normal input buffer units nBU a, nBU cm/cs, and nBU ck/cke, and respectively to output nodes of the test input buffer units tBU a, tBU cm/cs, and tBU ck/cke. The switch circuit units SWU21 to SWU23 supply either the control signals or test signals to an access control circuit 41.

More specifically, the switch circuit unit SWU21 includes a plurality of switch circuits (selector circuits). Each of the switch circuits included in the switch circuit unit SWU21 is electrically connected to an associated one of output nodes of the normal address input buffers included in the normal input buffer unit nBU a, and to an associated one of output nodes (connection nodes t1N2 1 to l) of the test address input buffers included in the test input buffer unit tBU a. Each of the switch circuits included in the switch circuit unit SWU21 supplies either a corresponding one of the address signals Add (control signals) or a corresponding one of the test address signals tAdd (test signals) to the access control circuit 41 from an output node thereof.

The switch circuit unit SWU22 also includes a, plurality of switch circuits (selector circuits). Each of the switch circuits included in the switch circuit unit SWU22 is electrically connected to an associated one of output nodes of the normal command input buffers included in the normal input buffer unit nBU cm/cs, and to an associated one of output nodes (connection nodes t2N2 1 to m+1) of the test command input buffers included in the test input buffer unit tBU cm/cs Each of the switch circuits included in the switch circuit unit SWU22 supplies either a corresponding one of the command signals CMD and chip select signals CS (control signals) or a corresponding one of the test command signals tCMD and test chip select signals tCS (test signals) to the access control circuit 41 from an output node thereof.

The switch circuit unit SWU23 also includes a plurality of switch circuits (selector circuits). Each of the switch circuits included in the switch circuit unit SWU23 is electrically connected to an associated one of output nodes of the normal clock input buffers included in the normal input buffer unit nBU ck/cke, and to an associated one of output nodes (connection nodes t3N2 1 to 2) of the test clock input buffers included in the test input buffer unit tBU ck/cke. Each of the switch circuits included in the switch circuit unit SWU23 supplies either a corresponding one of the clock signals CLK and clock enable signal CKE (control signals) or a corresponding one of the test clock signals tCLK and test clock enable signal tCKE (test signals) to the access control circuit 41 from an output node thereof.

Incidentally, although not shown in FIG. 6, the switch circuit units SWU 21 to SWU23 are configured to be controlled by a test enable signal. For example, the access control circuit 41 can activate the test enable signal depending on a combination of a predetermined test command and a predetermined test address.

The access control circuit 41 controls various operations of the channel ch A of the chip C1, such as a reading operation, writing operation, and refresh operation, in accordance with the control signals or the test signals supplied from outside the chip C1 via the switch circuit units SWU21 to SWU23.

The memory cell array 42 includes a plurality of memory cells MC. The access control circuit 41 accesses the memory cells MC in accordance with the command signal CMD and chip select signal CS (or the test command signal tCMD and test chip select signal tCS), and the address signal Add (or the test address signal tAdd). During the reading operation, the access control circuit 41 outputs the read data stored in the memory cells MC to a data input/output circuit 43. During the writing operation, the access control circuit 41 stores the write data output from the data input/output circuit 43 in the memory cells MC.

The data input/output circuit 43 operates in accordance with the clock signal CLK (or the test clock signal tCLK). During the reading operation, the data input/output circuit 43 outputs the read data received from the memory cell array 42 to outside the memory chip C1 via a data input/output unit. During the writing operation, the data input/output circuit 43 supplies the write data supplied from outside the chip C1 via the data input/output unit to the memory cell array 42.

The channel ch A includes the following units as a data input/output unit: a switch circuit unit SWU24, a normal data input/output buffer unit nBUDQ, and a test data input/output buffer unit tBUDQ. The normal data input/output buffer unit nBUDQ includes a plurality of normal data input buffers nBIDQ 1a to na, and a plurality of normal data output buffers nBODQ 1a to na. Hereinafter, one of the normal data input buffers nBIDQ 1a to na, and a corresponding one of a plurality of normal data output buffers nBODQ 1a to na may also be collectively referred to as normal data input/output buffers.

In one normal data input/output buffer, an input node of a normal data input buffer nBIDQ and an output node of a normal data output buffer nBODQ are connected to each other. The nodes are referred to as first connection nodes nBN1 (1a to na) of the normal data input/output buffer.

In one normal data input/output buffer, an output node of a normal data input buffer nBIDQ and an input node of a normal data output buffer nBODQ are connected to each other. The nodes are referred to as second connection nodes nBN2 (1a to na) of the normal data input/output buffer. The first connection nodes nBN1 (1a to na) of the normal data input/output buffers of the normal data input/output buffer unit nBUDQ are connected so as to correspond to the normal data input/output bumps nbDQ 1a to na. The second connection nodes nBN2 are connected to the switch circuit unit SWU24.

The test data input/output buffer unit tBUDQ includes a plurality of test data input buffers tBIDQ 1a to ka, and a plurality of test data output buffers tBODQ 1a to ka. Hereinafter, one of the test data input buffers tBIDQ 1a to ka, and a corresponding one of a plurality of test data output buffers tBODQ 1a to ka are also collectively referred to as test data input/output buffer.

In one test data input/output buffer, an input node of a test data input buffer tBIDQ and an output node of a test data output buffer tBODQ are connected to each other. The nodes are referred to as first connection nodes tBN1 1ka to ka of the test data input/output buffer.

In one test data input/output buffer, an output node of a test data input buffer tBIDQ and an input node of a test data output buffer tBODQ are connected to each other. The nodes are referred to as second connection nodes tBN2 1a to ka of the test data input/output buffer.

The first connection nodes tBN1 of each of the test data input/output buffers of the test data input/output buffer unit tBUDQ are connected in common to a corresponding one of the test data input/output bumps tbDQ 1a to ka, and a corresponding one of the test data input/output pads tpDQ 1a to ka. The second connection nodes tBN2 are connected to the switch circuit unit SWU 24.

In that manner, the test data input/output buffer unit tBUDQ of the present embodiment includes a plurality of test data input/output buffers which are provided correspondingly to a plurality of test data input/output terminal pairs each of which includes one test data input/output bump and one test data input/output pad. The first connection nodes of the test data input/output buffers are connected in common to a test data input/output bump and test data input/output pad contained in a corresponding test data input/output terminal pair.

In other words, the one test data input/output bump and the one test data input/output pad, which are included in each of the test data input/output terminal pairs, are connected to each other by a signal line inside the chip. A node on the signal line provided in the chip is electrically connected to the first connection nodes of a corresponding test data input/output buffer.

Incidentally, FIG. 6 shows the structure in which the test data input/output buffer unit tBUDQ includes both a plurality of test data input buffers tBIDQ 1a to ka and a plurality of test data output buffers tBODQ 1a to ka. However, in another possible structure, the test data input/output buffer unit tBUDQ may include either the test data input buffers tBIDQ 1a to ka or the test data output buffers tBODQ 1a to ka.

The switch circuit unit SWU24 includes a plurality of switch circuits (selector circuit), each of which is connected to a corresponding one of the second connection nodes BN2 and a corresponding one of the second connection nodes tBN2.

The switch circuits included in the switch circuit unit SWU24 each receive a corresponding one of a plurality of read data sets supplied from the data input/output circuit 43 during the reading operation; and supply the read data set to a corresponding one of the normal data input/output buffers, or to a corresponding one of the test data input/output buffers of the test data input/output buffer unit tBUDQ.

During the writing operation, the switch circuits included in the switch circuit unit SWU24 each receive write data supplied from the corresponding one of the normal data input/output buffers, or from the corresponding one of the test data input/output buffers of the test data input/output buffer unit tBUDQ; and supply the write data to the data input/output circuit 43.

The channels ch B to ch D each have the same circuit configuration as the channel ch A. As shown in FIG. 6, each of the channels ch B to ch D includes test data input/output pads tpDQ 1$i$ to k$i$ (i=b, c, d), normal data input/output bumps nbDQ 1$i$ to n$i$ (i=b, c, d), and test data input/output bumps tbDQ 1$i$ to k$i$ (i=b, c, d).

In that manner, the input side of each channel is so formed as to share the test signals. However, the output side is formed in such a way as to make the test data input/output pads and test data input/output bumps independent for each channel. In a test mode, the reading of test read data, and the writing of the test write data can be carried out independently for each channel.

Figure 7:
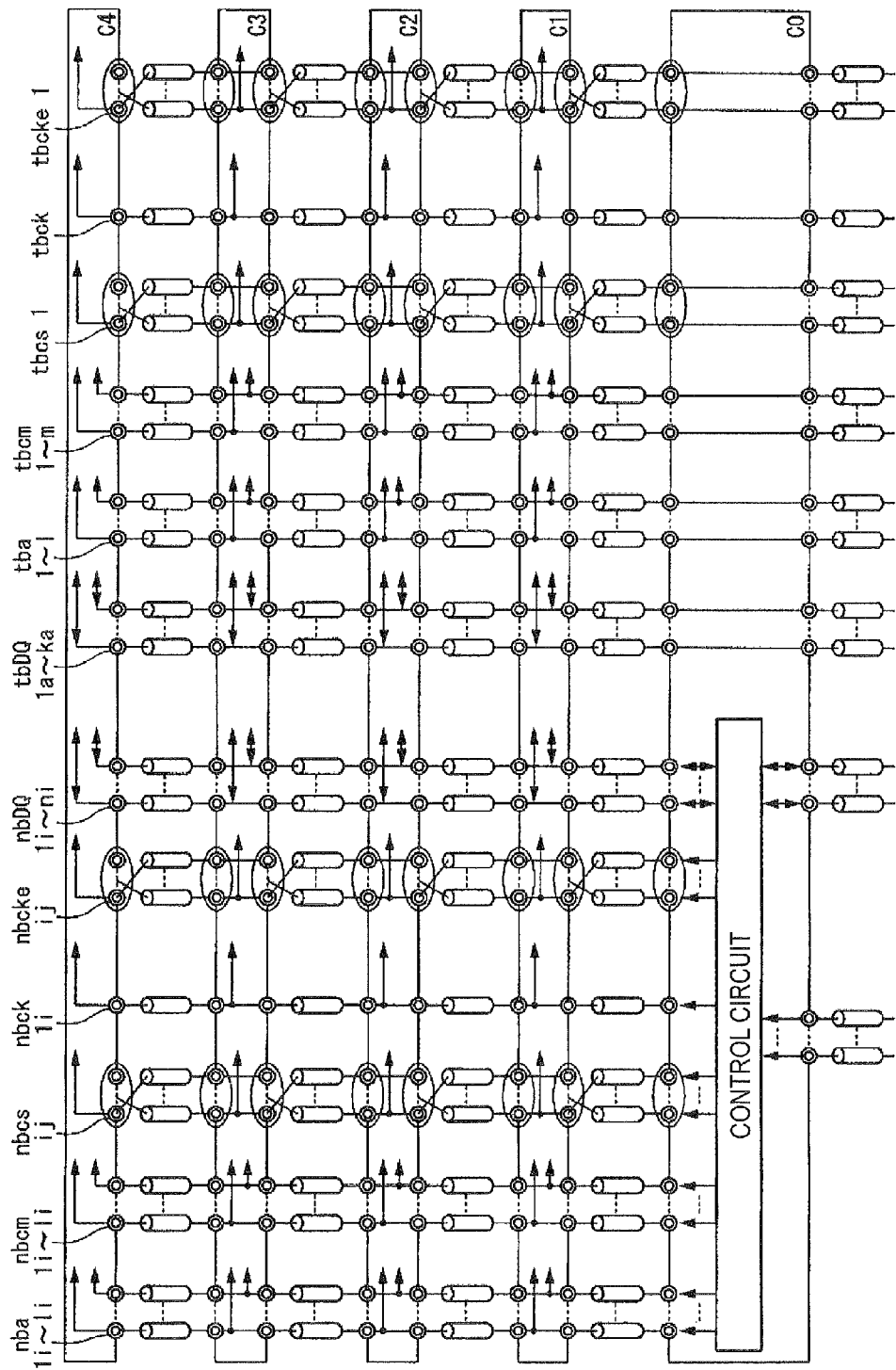
FIG. 7 is a diagram showing connection relation between the chips when the chips C0 to C4 are stacked.

The following describes how the normal bumps and the test bumps, which are shown in FIG. 6, are connected via the penetration electrodes TSV when the chips C0 to C4 are stacked with reference to FIG. 7.

First, the connection relation between the normal bumps will be described.

As shown in FIG. 7, in each of the chips C1 to C4, the following are connected to one another by the type of penetration electrodes TSVM1 shown in FIG. 2B. These penetration electrodes include the normal address bumps nba 1$i$ to l$i$ (i=a, b, c, d), normal command bumps nbcm 1$i$ to m$i$ (i=a, b, c, d), normal clock bumps nbck $i$ (i=a, b, c, d), and normal data input/output bumps nbDQ 1$i$ to n$i$ (i=a, b, c, d). The normal bumps connected to one another form signal paths (first control signal paths). Each of the first control signal paths is electrically connected to the control circuit(s) of the SOC chip C0. Each of the first control signal paths transmits one of the address signal Add, command signal CMD, clock signal CLK, and data DQ.

In each of the chips C1 to C4, the following are electrically connected to one another by the type of penetration electrodes TSVM2 shown in FIG. 2E. These penetration electrodes include the normal chip select bumps nbcs ij (i=a, b, c, d, j=1, 2, 3, 4), and normal clock enable bumps nbcke ij (i=a, b, c, d, j=1, 2, 3, 4). The normal bumps connected to one another form signal paths (second control signal paths). Each of the second control signal paths is electrically connected to the control circuit(s) of the SOC chip C0. Each of the second control signal paths transmits one of the chip select signal CSij (i=a, b, c, d, j=1, 2, 3, 4), which is part of the command signal CMD, and a clock enable signal CKEij (i=a, b, c, d, j=1, 2, 3, 4), which is part of the clock signal.

According to the above configuration, in the normal mode, the chip select signal CS and the clock enable signal CKE can be supplied independently to each of the channels ch A to ch D of each of the chips C1 to C4.

The following describes the connection of the test bumps. As shown in FIG. 7, in each of the chips C1 to C4, the following are connected to one another by the type of penetration electrodes TSVM1 shown in FIG. 2B. These penetration electrodes include the test address bumps tba 1 to l, test command bumps tbcm 1 to m, test clock bump tbck, and test data input/output bumps tbDQ 1$i$ to k$i$ (i=a, b, c, d). The test bumps connected to one another form signal paths (first test signal paths). Each of the first test signal paths is not electrically connected to any one of the control circuits of the SOC chip C0, but is electrically connected to the penetration electrode, the type of which is of the penetration electrode TSVS2 shown in FIG. 2A and which is formed on the SOC chip C0. Each of the first test signal paths transmits one of the test address signal tAdd, test command signal tCMD, test clock signal tCLK, and test data tDQ.

In each of the chips C1 to C4, the following are connected to one another by the type of penetration electrodes TSVM2 shown in FIG. 2B. These penetration electrodes include the test chip select bumps tbcs j (j=1, 2, 3, 4), and the test clock enable bumps tbcke j (j=1, 2, 3, 4). Each of the test bumps connected to one another form signal paths (second test signal paths). Each of the second test signal paths is not electrically connected to a control circuit of the SOC chip C0, but is electrically connected to a penetration electrode, the type of which is of the penetrating electrode TSVS2 shown in FIG. 2A and which is formed on the SOC chip C0. Each of the second test signal paths transmits one of the test chip select signal tCSj (j=1, 2, 3, 4), which is part of the test command signal tCMD, and a test clock enable signal tCKEj (j=1, 2, 3, 4), which is part of the test clock signal tCKL.

According to the above configuration, in a test mode, the test chip select signal tCS and the test clock enable signal tCKE can be supplied independently to each of the chips C1 to C4.

As described above, each of the test pads and each of the test bumps are connected in common to one of input nodes of the corresponding one of the switch circuit units via a corresponding one of buffers. The one of input nodes of the corresponding one of the switch circuit units can be used for test signals, which are transmitted within the first semiconductor chip.

Therefore, according to this embodiment of the present invention, there is no need to provide different signal lines for test signals before and after the chip C1 is stacked on the chip C0, thereby avoiding an increase in the number of signal lines in a semiconductor chip at a time when a test terminal is disposed on the semiconductor chip of a stacked semiconductor device.

Second Embodiment

The following describes a second embodiment of the present invention. According to the second embodiment, other switch circuit units are provided between the switch circuit units SWU21 to SWU24 and the test bumps and the test pads. The other switch circuit unit can select one of the test signals from the test bumps and the test signals from the test pads.

Figure 8:
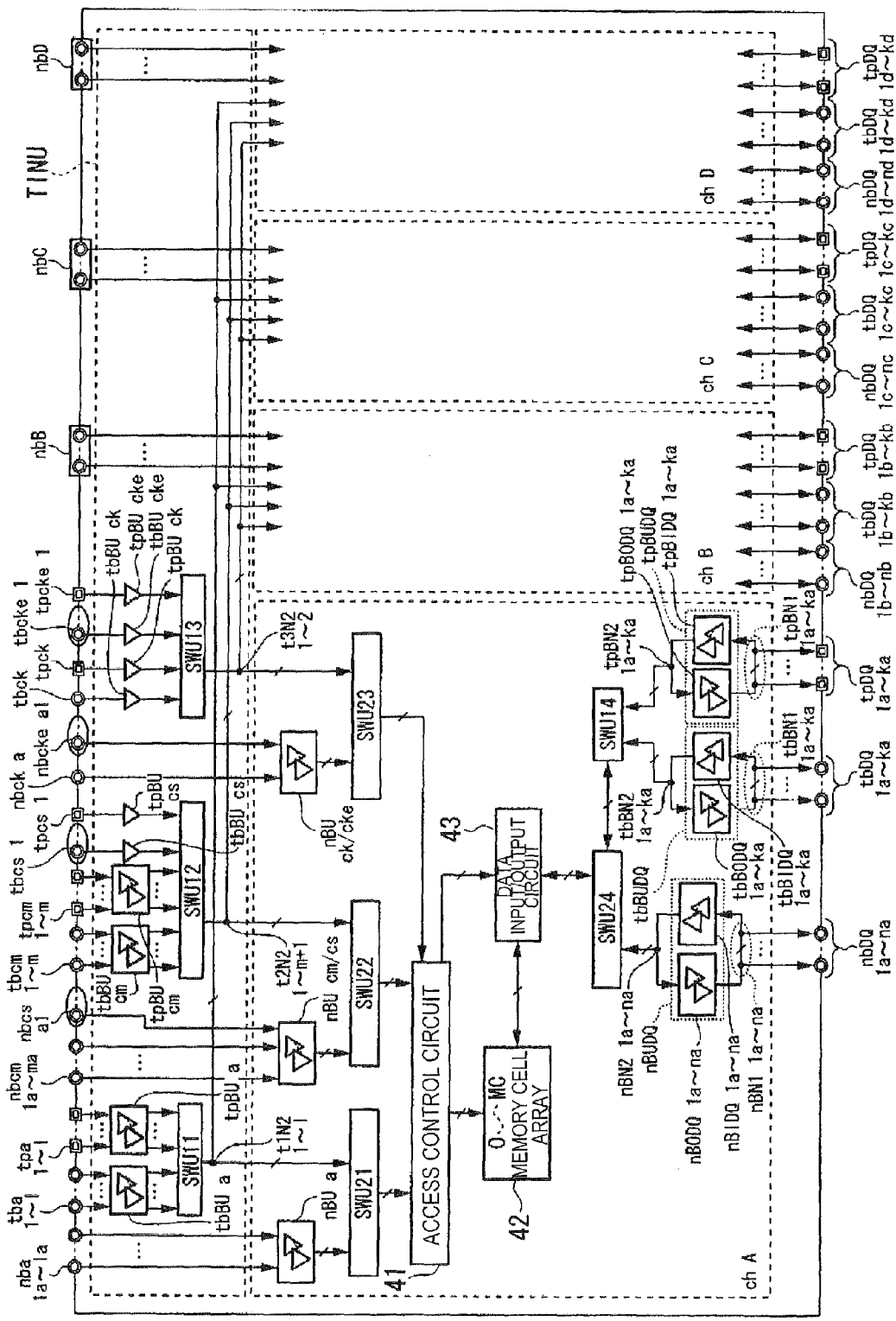
FIG. 8 is a block diagram showing a chip C1 of the second embodiment of the present invention in detail.

Incidentally, in FIG. 8, the same portions as those in FIG. 6 are represented by the same reference symbols, and the description thereof will be omitted when necessary.

More specifically, the second embodiment is different from the first embodiment in the following respects in terms of configuration.

A test signal input unit TINU includes test input buffer units and switch circuit units, which are described below, instead of the three test input buffer unit tBU a, test input buffer unit tBU cm/cs, and test input buffer unit tBU ck/cke shown in FIG. 6.

That is, the test signal input unit TINU includes four test input buffer unit tbBU a, test input buffer unit tpBU a, test input buffer unit tbBU cm, and test input buffer unit tpBU cm.

The test signal input unit TINU also includes six test input buffer tbBU cs, test input buffer tpBU cs, test input buffer tbBU ck, test input buffer tpBU ck, test input buffer tbBU cke, and test input buffer tpBU cke. The test signal input unit TINU also includes three switch circuit units SWU11 to SWU13.

The test input buffer unit tbBU a includes a plurality of test address input buffers each having an input node electrically connected to an associated one of the test address bumps tba 1 to l.

The test input buffer unit tpBU a includes a plurality of test address input buffers each having an input node electrically connected to an associated one of the test address pads tpa 1 to l.

The test input buffer unit tbBU cm includes a plurality of test command input buffers each having an input node electrically connected to an associated one of the test command bumps tbcm 1 to m.

The test input buffer unit tpBU cm includes a plurality of test command input buffers each having an input node electrically connected to an associated one of the test command pads tpcm 1 to m.

The test input buffer unit tbBU cs has an input node electrically connected to the test chip select bump tbcs 1.

The test input buffer unit tpBU cs has an input node electrically connected to the test chip select pad tpcs 1.

The test input buffer unit tbBU ck has an input node electrically connected to the test clock bump tbck.

The test input buffer unit tpBU ck has an input node electrically connected to the test clock pad tpck.

The test input buffer unit tbBU cke has an input node electrically connected to the test clock enable bump tbcke.

The test input buffer unit tpBU cke has an input node electrically connected to the test clock enable pad tpcke.

The switch circuit units SWU11 to SWU13 are electrically connected to the output nodes of the test input buffer units or the test input buffers. The switch circuit units SWU11 to SWU13 supplies either the test signals that will be input to the test bumps or the test signals that will be input to the test pads to the subsequent switch circuit units SWU21 to SWU23.

More specifically, the switch circuit unit SWU11 is electrically connected to output nodes of the test address input buffers included in the test input buffer unit tbBU a, and to output nodes of the test address input buffers included in the test input buffer unit tpBU a. The switch circuit unit SWU11 includes a plurality of switch circuits that selects either the test address signals tAdd supplied from the test bumps tba 1 to l or the test address signals tAdd supplied from the test pads tpa 1 to l. Selected test address signals tAdd are supplied to the switch circuit unit SWU21 via the connection nodes t1N2 1 to l.

The switch circuit unit SWU12 is electrically connected to output nodes of the test command input buffers included in the test input buffer unit tbBU cm, and output nodes of the test command input buffers included in the test input buffer unit tpBU cm. The switch circuit unit SWU12 is also electrically connected to an output node of the test input buffer tbBU cs, and an output node of the test input buffer tpBU cs.

The switch circuit unit SWU12 includes a plurality of switch circuits that selects either the test command signals tCMD supplied from the test bumps tbcm 1 to m or the test command signals tCMD supplied from the test pads tpcm 1 to m, and selects either the test chip select signal tCS supplied from the test bump tbcs 1 or the test chip select signal tCS supplied from the test pad tpcs 1. Selected test command signals tCMD and chip select signal tCS are supplied to the switch circuit unit SWU22 via the connection nodes t2N2 1 to m+1.

The switch circuit unit SWU13 is electrically connected to an output node of the test input buffer tbBU ck, and to an output node of the test input buffer tpBU ck. The switch circuit unit SWU13 is also electrically connected to an output node of the test input buffer tbBU cke, and to an output node of the test input buffer tpBU cke.

The switch circuit unit SWU13 includes a plurality of switch circuits that selects either the test clock signal tCK supplied from the test bumps tbck or the test clock signal tCK supplied from the test pads tpck, and selects either the test clock enable signal tCKE supplied from the test bump tbcke 1 or the test clock enable signal tCKE supplied from the test pad tpcke 1. Selected test clock signal tCK and clock enable signal tCKE are supplied to the switch circuit unit SWU23 via the connection nodes t3N2 1 to 2.

The following describes the differences between the internal configuration of the channel ch A shown in FIG. 8 and the internal configuration of the channel ch A shown in FIG. 6. Incidentally, the channels ch B to ch D have the same configuration as the channel ch A, and the description thereof will therefore be omitted when necessary.

As data input/output units, the channel ch A includes a test data input/output buffer unit tbBUDQ, a test data input/output buffer unit tpBUDQ, and a switch circuit unit SWU14, instead of the test data input/output buffer units tBUDQ.

The test data input/output buffer unit tbBUDQ includes a plurality of test data input buffers tbBIDQ 1a to ka, and a plurality of test data output buffers tbBODQ 1a to ka. Hereinafter, one of the test data input buffers tbBIDQ 1a to ka and a corresponding one of the test data output buffers tbBODQ 1a to ka may be collectively referred to as a test data input/output buffer.

In one test data input/output buffer, an input node of a test data input buffer tbBIDQ and an output node of a test data output buffer tbBODQ are electrically connected in common. The nodes are referred to as first connection nodes tbBN1 1a to ka of the test data input/output buffer.

In one test data input/output buffer, an output node of a test data input buffer tbBIDQ and an input node of a test data output buffer tbBODQ are electrically connected in common. The nodes are referred to as second connection nodes tbBN2 1a to ka of the test data input/output buffer.

A first connection node tbBN1 of each of the test data input/output buffers included in the test data input/output buffer unit tbBUDQ is electrically connected in common to a corresponding one of the test data input/output bumps tbDQ 1a to ka. A second connection node tbBN2 thereof is electrically connected to the switch circuit unit SWU14.

In that manner, the test data input/output buffer unit tbBUDQ of the present embodiment includes the test data input/output buffers, which are so provided as to correspond to the test data input/output bumps. The first connection nodes of the test data input/output buffers are electrically connected in common to the corresponding test data input/output bumps.

The test data input/output buffer unit tpBUDQ includes a plurality of test data input buffers tpBIDQ 1a to ka, and a plurality of test data output buffers tpBODQ 1a to ka. Hereinafter, one of the test data input buffers tpBIDQ 1a to ka and a corresponding one of the test data output buffers tpBODQ 1a to ka may be collectively referred to as a test data input/output buffer.

In one test data input/output buffer, an input node of a test data input buffer tpBIDQ and an output node of a test data output buffer tpBODQ are electrically connected in common. The nodes are referred to as first connection nodes tpBN1 1a to ka of the test data input/output buffer.

In one test data input/output buffer, an output node of the test data input buffer tpBIDQ and an input node of the test data output buffer tpBIDQ are electrically connected in common. The nodes are referred to as second connection nodes tpBN2 1a to ka of the test data input/output buffer.

A first connection node tpBN1 of each of the test data input/output buffers included in the test data input/output buffer unit tpBUDQ is electrically connected in common to a corresponding one of the test data input/output pads tpDQ 1a to ka. A second connection node tpBN2 thereof is electrically connected to the switch circuit unit SWU14.

In that manner, the test data input/output buffer unit tpBUDQ of the present embodiment includes the test data input/output buffers, which are so provided as to correspond to the test data input/output pads. The first connection nodes of the test data input/output buffers are electrically connected in common to the corresponding test data input/output pads.

In other words, different from the first embodiment, one test data input/output bump and one test data input/output pad included in the test data input/output terminal pairs are not connected by a signal line in the chip, but are connected to the first connection nodes of the corresponding test data input/output buffers.

The switch circuit unit SWU14 includes a plurality of switch circuits, each of which is electrically connected to an associated one of the second connection node tbBN2 of the normal data input/output buffers included in the test data input/output buffer unit tbBUDQ, and to an associated one of the second connection node tpBN2 of the test data input/output buffers included in the test data input/output buffer unit tpBUDQ.

The switch circuits included in the switch circuit unit SWU14 each receive a corresponding one of a plurality of read data sets from the data input/output circuit 43 during the reading operation via the switch circuit unit SWU24. The switch circuits included in the switch circuit unit SWU14 supply the read data set to a corresponding one of a plurality of test data input/output buffers of the test data input/output buffer unit tbBUDQ, or to a corresponding one of the test data input/output buffers included in the test data input/output buffer unit tpBUDQ.

The switch circuits included in the switch circuit unit SWU14 each receive, during the writing operation, the write data supplied from a corresponding one of the test data input/output buffers included in the test data input/output buffer unit tbBUDQ, from a corresponding one of the test data input/output buffers included in the test data input/output buffer unit tpBUDQ. The switch circuits included in the switch circuit unit SWU14 supply the write data to the data input/output circuit 43 via the switch circuit unit SWU24.

As in the case of the channel ch A, the channels ch B to ch D each include test data input/output buffer units tbBUDQ for test data input/output bumps tbDQ 1i to ki (i=b, c, d); test data input/output buffer units tpBUDQ for test data input/output pads tpDQ 1i to ki (i=b, c, d); and switch circuit units SWU14.

According to the second embodiment of the present invention, for example, during a test operation after the chips C1 to C4 are stacked on the chip C0, even if noise is applied to the test pads inside the channels from circuits or wires inside the channels, and incorrect voltage is applied, the test pads can be electrically separated from the internal circuits of each channel by the switch circuit units SWU11 to SWU14. Therefore, an accidental test operation can be prevented.

In the first or second embodiment, in each channel of each chip, the reading operation, the writing operation, and the like can be tested independently.

For example, from a test device, among the test signals, the test address signal tAdd, the test command signal tCMD, the test clock signal tCLK, and the test data tDQ are supplied to the first test signal paths that are electrically connected to one another by the type of penetration electrodes TSVM1 shown in FIG. 2B.

Moreover, from a test device, among the test signals, test chip select signals tCSj (j=1, 2, 3, 4), and test clock enable signals tCKEj (j=1, 2, 3, 4), which are among the test clock signals tCLK, are supplied to the second test signal paths (which are the test signal paths that transmit test signals associated with the selection of one chip from among the chips C1 to C4, out of the test signal paths) that are electrically connected to one another by the type of penetration electrodes TSVM2 shown in FIG. 2B.

Therefore, in the stacked semiconductor device 10, in one of the chips C1 to C4, the channels ch A to ch D each are selected; for example, the inputting and outputting of test data tDQ are carried out independently between the channels, and a writing test or reading test is performed.

The technical ideas of the present invention may be applied to a semiconductor device having a memory function. Furthermore, the circuitry form within each circuit block, which is disclosed in the drawings, as well as a circuit that generates other control signals, is not limited to the circuitry form disclosed in examples.

Within the range of claims of the present invention, various components disclosed may be combined, or selected, in various ways. That is, various alterations and modifications that a person of ordinary skill in the art can make in accordance with all information disclosed, including the claims, and the technical ideas are within the scope of the present invention.

For example, according to the present embodiments, what is described is an example in which the penetration electrodes TSV are used to form signal paths, thereby connecting the chips together. However, the present invention is also effective even when the penetration electrodes TSV are not used, and the chips are connected by wire bonding technology.

Another stacked semiconductor device where semiconductor chips are connected to each other by wire bonding technology is explained with reference to FIG. 9.

Figure 9:
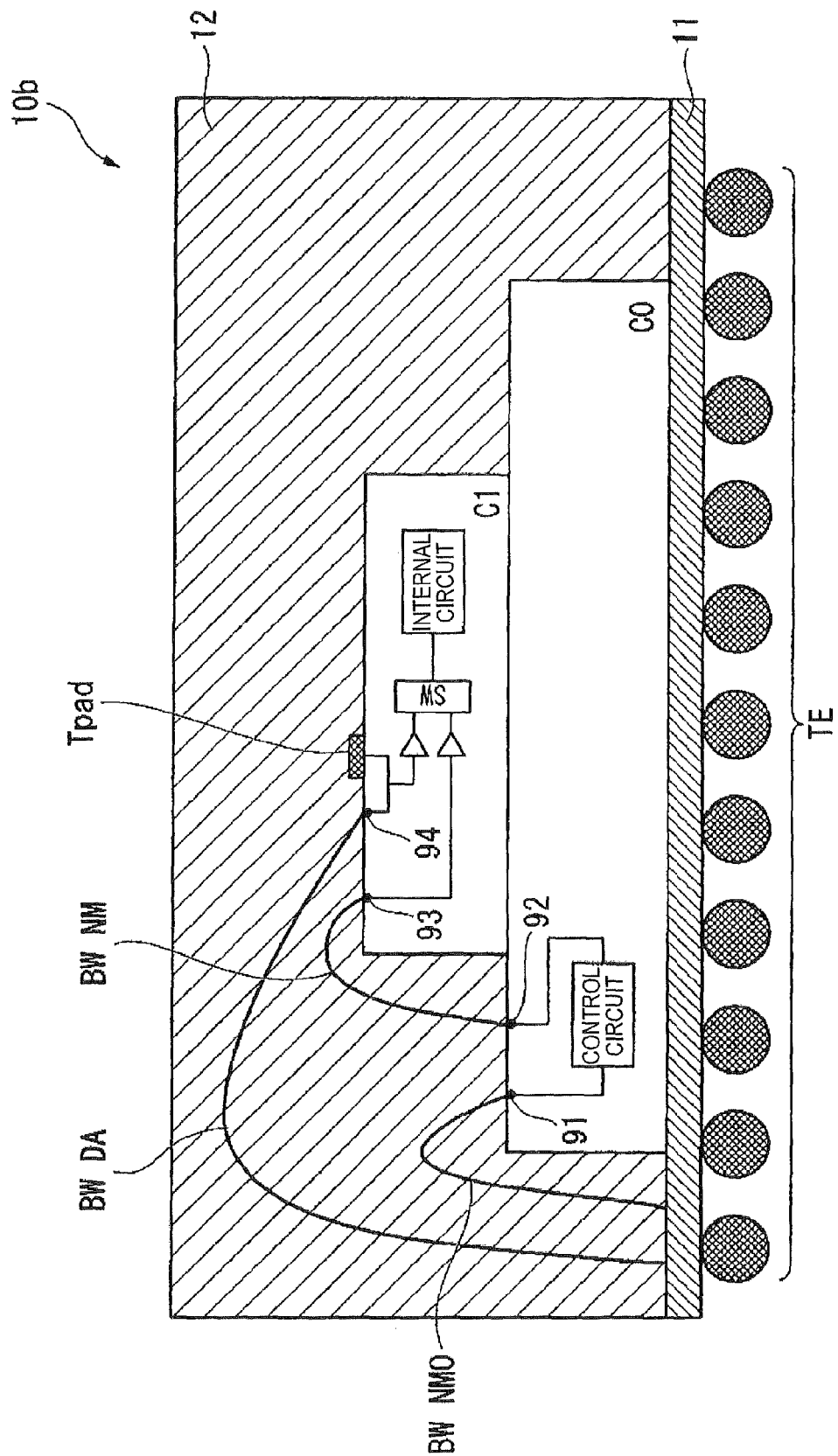
FIG. 9 is a cross-sectional view showing the schematic configuration of a stacked semiconductor device 10b where chips are connected to each other by wire bonding technology.

In FIG. 9, the same portions as those in FIG. 1 are represented by the same reference symbols, and the description thereof will be omitted. As shown in FIG. 9, an input terminal 91 (corresponding to a bump electrode 13 in FIG. 1) of a control circuit of the chip C0 is electrically connected to a rewiring layer (not shown in FIG. 9) formed on the package substrate 11 by a bonding wire BW NW0. To the input terminal 91, a control signal is supplied from an external device via an external connection terminal TE.

An input terminal 93 (corresponding to a normal bump electrode 13 in FIG. 1) of the chip C1 stacked on the chip C0 is electrically connected to an output terminal 92 of the control circuit of the chip C0 by a bonding wire BW NW. To the input terminal 93 of the chip C1, a control signal (which is for example a command signal CMD in the case of the first embodiment) is supplied from the control circuit of the chip C0.

An input terminal 94 (corresponding to a test bump electrode 13 in FIG. 1) of the chip C1 is electrically connected to the rewiring layer formed on the package substrate 11 by a bonding wire BW DA. To the input terminal 94, a test signal is supplied from an external device via an external connection terminal TE.

In that manner, according to the first and second embodiments, the test signal paths that are used for a test after the chips are stacked are the test signal paths that are made up of a group of penetration electrodes TSV. However, in the present example shown in FIG. 9, the test signal paths are those formed by the bonding wire BW DA. That is, the present invention can be applied not only to a stacked semiconductor device that uses penetration electrodes, but also to a stacked semiconductor device that uses the bonding wire technology.

What is claimed is:

1. A device comprising:
a plurality of external terminals including first and second external terminals;
a first semiconductor chip including a plurality of control circuits that comprises a first control circuit, the first control circuit generating a first control signal; and
a second semiconductor chip stacked with the first semiconductor chip, the second semiconductor chip comprising;
a first test terminal configured to be supplied with a first test signal, the first test terminal being free from connecting to any one of the external terminals;
a second test terminal configured to be supplied with the first test signal, the second test terminal being coupled to the first external terminal without connecting to any one of control circuits of the first semiconductor chip;
a first normal terminal configured to be supplied with the first control signal, the first normal terminal being coupled to the second external terminal with an intervention of the first control circuit of the first semiconductor chip; and
a first selection circuit including first and second input nodes, the first input node being coupled in common to the first and second test terminals and the second input node being coupled to the first normal terminal.

2. The device as claimed in claim 1, wherein the second semiconductor chip further comprises a first test input buffer coupled in common to the first and second test terminals at an input node thereof and coupled to the first input node of the first selection circuit at an output node thereof.

3. The device as claimed in claim 1, wherein the second semiconductor chip further comprises first and second test input buffers, the first test input buffer is coupled to the first test terminal at an input node thereof, the second test input buffer is coupled to the second test terminal at an input node thereof, and the first input node of the first selection circuit is coupled in common to output nodes of the first and second test input buffers.

4. The device as claimed in claim 1, wherein the control circuits of the first semiconductor chip comprises a plurality of second control circuits generating a plurality of second control signals, and the second semiconductor chip further comprises;

a plurality of second normal terminals each configured to be supplied with an associated one of the second control signals, and
a plurality of second selection circuits each including first and second input nodes, the first input node of each of the second selection circuits being coupled in common to the first and second test terminals, and the second input node of each of the second selection circuits being coupled to an associated one of the second normal terminals.

5. The device as claimed in claim 4, wherein the second semiconductor chip further comprises;
a first channel comprising the first selection circuit, and
a plurality of second channel each comprising an associated one of the second selection circuits, and
the first and second internal devices are configured to operate independently of each other.

6. The device as claimed in claim 5, wherein each of the first and second channels is configured to operate as DRAM.

7. The device as claimed in claim 1, wherein the first semiconductor chip further comprises;
a semiconductor substrate,
a first penetration electrode penetrating through the semiconductor substrate and being free from connecting to any one of the control circuits, the first penetration electrode being coupled to the second test terminal of the second semiconductor chip, and
a second penetration electrode penetrating through the semiconductor substrate and coupled to the first control circuit, the second penetration electrode being coupled to the first normal terminal of the second semiconductor chip.

8. The device as claimed in claim 1, wherein the second semiconductor chip further comprises;
a semiconductor substrate,
a first test penetration electrode penetrating through the semiconductor substrate and coupled to the second test terminal, and
a first normal penetration electrode penetrating through the semiconductor substrate and coupled to the first normal terminal.

9. The device as claimed in claim 1, wherein the first test terminal is a test pad, each of the second test terminal and the first normal terminal is a bump electrode.

10. The device as claimed in claim 1, wherein the first test terminal is a test pad, each of the second test terminal and the first normal terminal is a bonding pad coupled to a bonding wiring.

11. The device as claimed in claim 1, wherein the first test signal includes one of a test address signal, a test command signal and a test clock signal, and the first control signal includes one of a normal address signal, a normal command signal and a normal clock signal.

* * * * *